United States Patent
Miao et al.

(10) Patent No.: US 10,211,243 B2
(45) Date of Patent: Feb. 19, 2019

(54) EDGE REFLECTION REDUCTION

(71) Applicant: OmniVision Technologies, Inc., Santa Clara, CA (US)

(72) Inventors: Chia-Chun Miao, Sunnyvale, CA (US); Yin Qian, Milpitas, CA (US); Chao-Hung Lin, San Ramon, CA (US); Chen-Wei Lu, San Jose, CA (US); Dyson H. Tai, San Jose, CA (US); Ming Zhang, Fremont, CA (US); Jin Li, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/945,541

(22) Filed: Apr. 4, 2018

(65) Prior Publication Data

US 2018/0226448 A1    Aug. 9, 2018

Related U.S. Application Data

(62) Division of application No. 15/430,071, filed on Feb. 10, 2017, now Pat. No. 9,966,404, which is a division
(Continued)

(51) Int. Cl.
*H01L 31/0203* (2014.01)
*H01L 27/146* (2006.01)

(52) U.S. Cl.
CPC .. *H01L 27/14623* (2013.01); *H01L 27/14618* (2013.01); *H01L 27/14625* (2013.01); *H01L 27/14685* (2013.01); *H01L 27/14687* (2013.01)

(58) Field of Classification Search
CPC ......... H01L 27/14618; H01L 27/14625; H01L 27/14685; H01L 27/14623
(Continued)

(56) References Cited

U.S. PATENT DOCUMENTS

| 5,654,731 A | 8/1997 | Stewart et al. |
| 6,429,036 B1 | 8/2002 | Nixon et al. |

(Continued)

FOREIGN PATENT DOCUMENTS

CN    104078479 A    10/2014

OTHER PUBLICATIONS

First Chinese Office Action and Translation dated May 3, 2018, for Chinese Application No. 201710066831.2, filed Feb. 7, 2017, 11 pages.
(Continued)

*Primary Examiner* — Theresa T Doan
(74) *Attorney, Agent, or Firm* — Christensen O'Connor Johnson Kindness PLLC

(57) ABSTRACT

A method of image sensor package fabrication includes providing an image sensor, including a pixel array disposed in a semiconductor material, and a first transparent shield adhered to the semiconductor material. The pixel array is disposed between the semiconductor material and the first transparent shield. A light blocking layer is deposited and disposed between lateral edges of the pixel array and lateral edges of the first transparent shield, and a second transparent shield is placed on the image sensor package, where the light blocking layer is disposed between the first transparent shield and the second transparent shield.

5 Claims, 8 Drawing Sheets

Related U.S. Application Data of application No. 15/144,194, filed on May 2, 2016, now Pat. No. 9,608,023.

(58) Field of Classification Search
USPC .......................................................... 257/434
See application file for complete search history.

(56) References Cited

U.S. PATENT DOCUMENTS

| | | |
|---|---|---|
| 9,842,874 B2 | 12/2017 | Nakata |
| 2006/0281215 A1* | 12/2006 | Maruyama ........ H01L 27/14625 |
| | | 438/57 |
| 2010/0164881 A1 | 7/2010 | Kuo et al. |
| 2013/0153393 A1 | 6/2013 | Omote et al. |
| 2015/0116245 A1 | 4/2015 | Tseng et al. |
| 2016/0172399 A1 | 6/2016 | Nakata |

OTHER PUBLICATIONS

Taiwanese Office Action and Translation dated Oct. 27, 2017, for Taiwanese Application No. 106103888, filed Feb. 7, 2017, 6 pages.

* cited by examiner

EDGE REFLECTION REDUCTION

CROSS-REFERENCE TO RELATED APPLICATIONS

This application is a divisional of U.S. patent application Ser. No. 15/430,071, filed Feb. 10, 2017, now pending, which is a divisional of U.S. patent application Ser. No. 15/144,194, filed on May 2, 2016, both of which are hereby incorporated by reference.

TECHNICAL FIELD

This disclosure relates generally to image sensors, and in particular but not exclusively, relates to edge reflection reduction.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Electronic packaging is a sub discipline in the field of electrical engineering. Packaging refers to the protective features built into electronic devices. Packaging of microelectronics must take into consideration protection from mechanical abrasion, excessive heat, electrostatic discharge, and cost, among other things. While many consumer electronics may use time tested packaging methods, state of the art electronic devices may require highly specialized packaging in order for the device to work properly.

As image sensors scale down so must their packaging. However, down-scaling of packaging presents similar problems to down-scaling of microelectronic devices. New smaller packaging components may not dissipate heat as effectively as older larger components, and dated assembly techniques may be frustrated due to the miniature size of modern devices. Accordingly, electronic packaging needs to keep pace with advancements in the underlying semiconductor devices.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
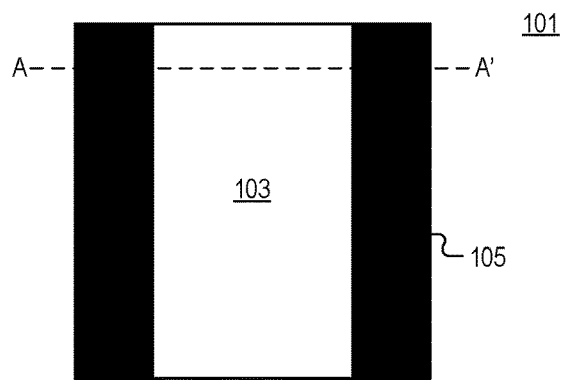
FIGS. 1A-1N are illustrations of top down and cross sectional views of image sensor packages, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for edge reflection reduction are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

Figure 1B:
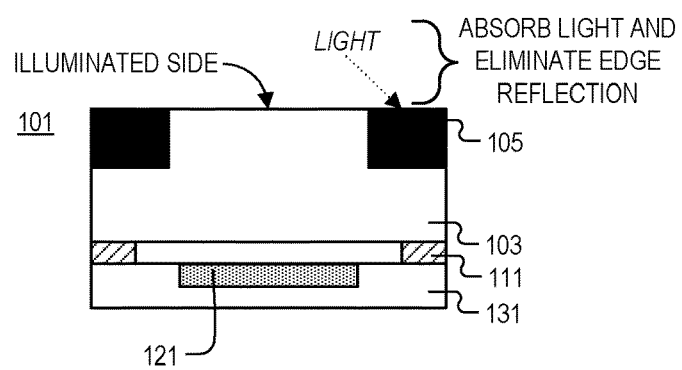
Figure 1C:
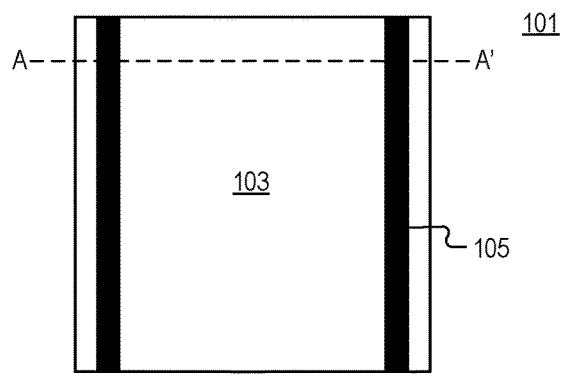
Figure 1D:
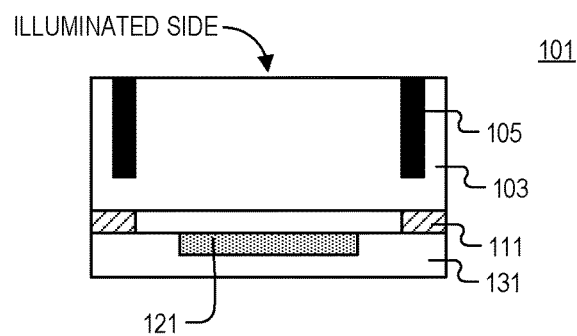
Figure 1E:
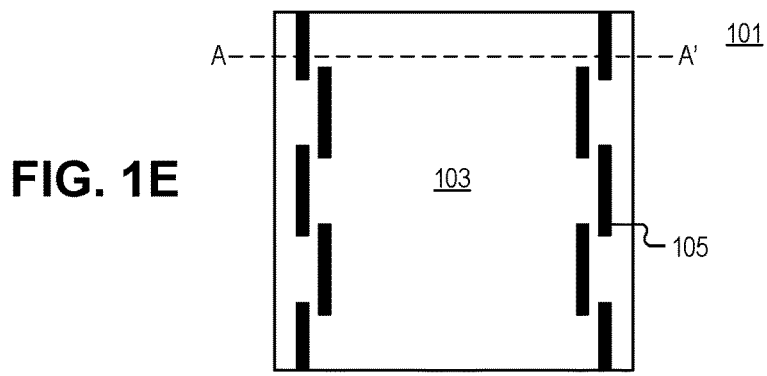
Figure 1F:
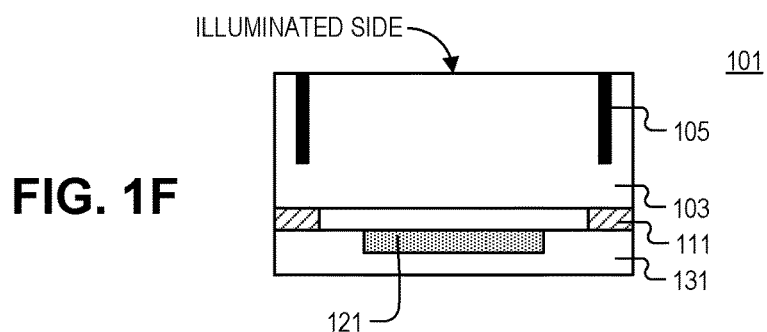
Figure 1G:
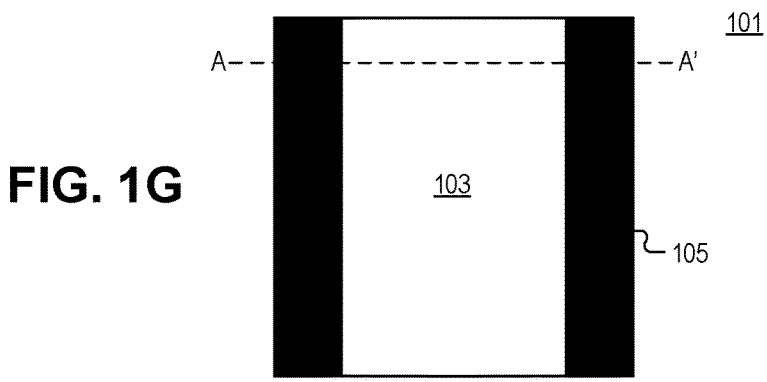
Figure 1H:
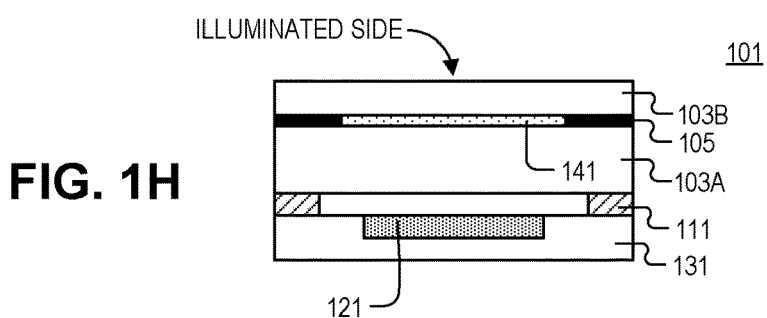
Figure 1I:
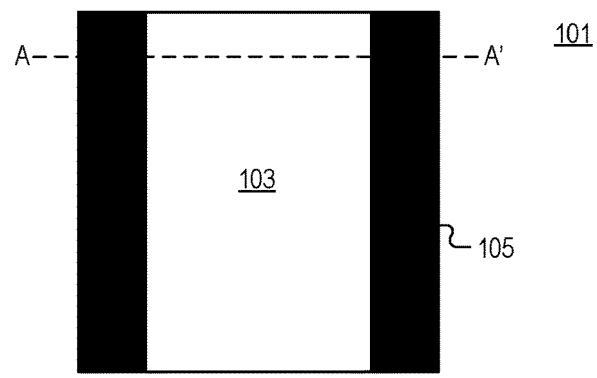
Figure 1J:
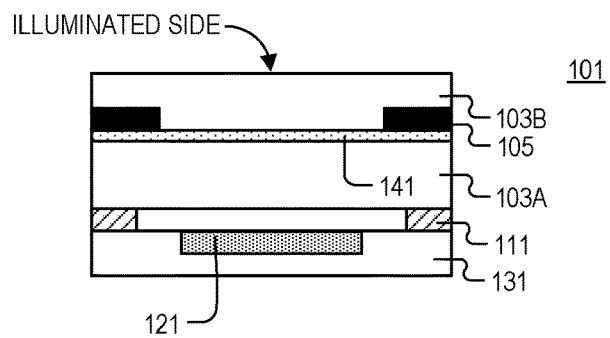
Figure 1K:
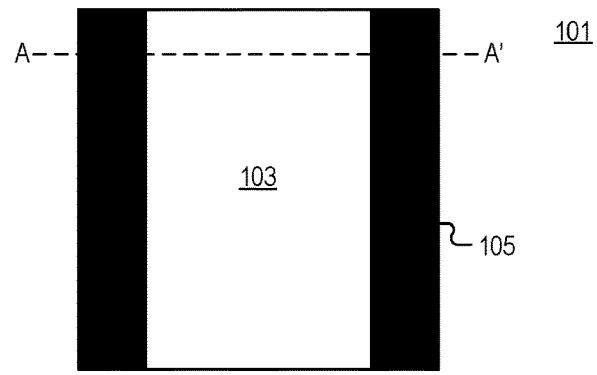
Figure 1L:
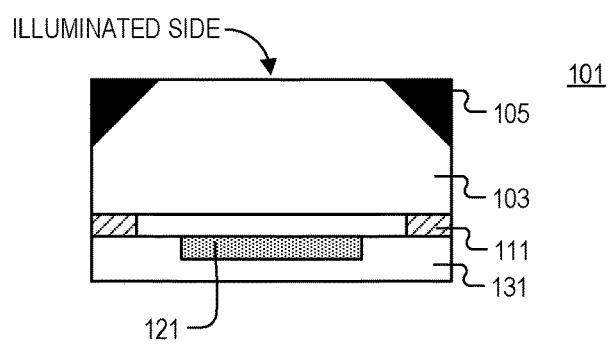
Figure 1M:
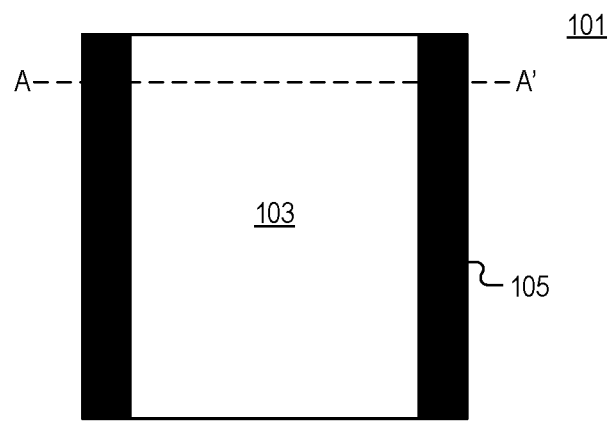
Figure 1N:
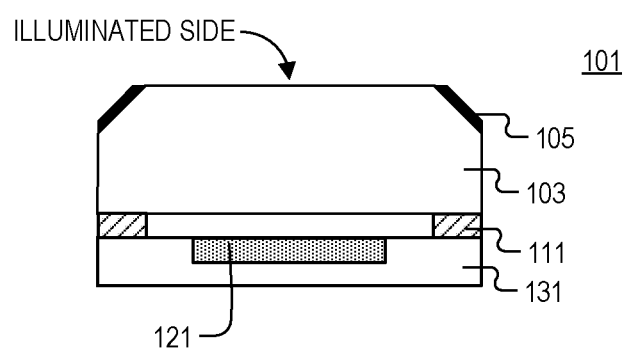

FIGS. 1A-1N are illustrations of top down and cross sectional views of image sensor packages 101. All of the embodiments depicted in FIGS. 1A-1N share common components, namely: transparent shield 103, light blocking layer 105, pixel array 121, semiconductor material 131, and dams 111. As will be shown, these components may be rearranged into a variety of configurations; however, all have a similar basic structure, in accordance with the teachings of the present invention. Although many examples are depicted herein, others have not been illustrated to avoid obscuring certain aspects.

FIG. 1A depicts a top down view of image sensor package 101. In the depicted example, light blocking layer 105 is arranged into two strips which run along the edges of transparent shield 103.

FIG. 1B illustrates a cross section of image sensor package 101 in FIG. 1A as cut along line A-A'. As shown, the image sensor includes pixel array 121 disposed in semiconductor material 131. Transparent shield 103 is adhered to semiconductor material 131 (with dams 111), and pixel array 121 is disposed between semiconductor material 131 and transparent shield 103. An empty/air gap is disposed between pixel array 121 and transparent shield 103. Light blocking layer 105 is disposed in recessed regions of transparent shield 103, and the recessed regions are disposed on an illuminated side of transparent shield 103. More specifically, the recessed regions are disposed on opposite lateral edges of transparent shield 103, and the width of the recessed regions is greater than the depth of the recessed regions into transparent shield 103.

In the depicted example, lateral bounds of transparent shield 103 extend beyond lateral bounds of pixel array 121, and the recessed regions and light blocking layer 105 are disposed in portions of transparent shield 103 that extend beyond the lateral bounds of pixel array 121. In other words, in the depicted example, pixel array 121 extends laterally across, or occupies, only part of semiconductor material 131 and transparent shield 103 is coextensive with semiconductor material 131. Recessed regions and light blocking layer 105 are disposed in the areas of transparent shield 103 that are not directly above pixel array 121 so that image light is not obstructed on its way to pixel array 121. The optical path between pixel array 121 and the image subject is clear of obstruction. In some examples, the thickness of transparent shield 103 may be 1.5-2 times the distance from a near edge of pixel array 121 to a near edge of transparent shield 103. In some examples, the height of dam 111 may be approximately $1/10^{th}$ the thickness of transparent shield 103.

Light blocking layer 105 is disposed to prevent light from reflecting off edges of transparent shield 103 into the image sensor. In the depicted example, light blocking layer 105 is positioned so that light incident on image sensor package 101 cannot reflect off an edge of transparent shield 103, and be directed into pixel array 121. Light incident on image sensor package 101 that would be reflected into pixel array 121 is absorbed by light blocking layer 105. This helps to mitigate unwanted optical effects in images generated by pixel array 121 by reducing the amount of glare reflected off edges of transparent shield 103.

FIG. 1C depicts a top down view of another example of image sensor package 101. Image sensor package 101 is similar to image sensor package 101 of FIGS. 1A & 1B in that, in the depicted example, light blocking layer 105 is arranged into two strips which parallel the edges of transparent shield 103. However, the two strips of light blocking layer 105 are offset from the edges of transparent shield 103 by a distance.

FIG. 1D shows a cross section of image sensor package 101 in FIG. 1C as cut along line A-A'. As depicted, the recessed regions and light blocking layer 105 are disposed a distance from the edges of transparent shield 103, and the width of the recessed regions is less than the depth of the recessed regions into transparent shield 103. As shown, the recessed regions extend far enough into transparent shield 103 so that image light incident on image sensor package 101 cannot be reflected off the edges of transparent shield 103 and into pixel array 121.

FIG. 1E depicts a top down view of yet another example of image sensor package 101. Image sensor package 101 in FIG. 1E is similar to image sensor package 101 in FIGS. 1C & 1D in that light blocking layer 105 is arranged into strips which parallel the edges of transparent shield 103 and the strips are distanced from the edges. However, the recessed regions in FIG. 1E are arranged into an offset staggered pattern on opposite lateral sides of transparent shield 103. In the depicted example, the strips of light blocking layer 105 partially overlap in the horizontal direction, to prevent light from reaching the edge of transparent shield 103. This type of pattern may be referred to as a "Warpage relief structure".

FIG. 1F shows a cross section of image sensor package 101 in FIG. 1E as cut along line A-A'. As depicted, the recessed regions and light blocking layer 105 are disposed a distance from the edges of transparent shield 103, and the width of the recessed regions is less than the depth of the recessed regions into transparent shield 103. As shown, the recessed regions extend far enough into transparent shield 103 so that image light incident on image sensor package 101 cannot be reflected off the edges of transparent shield 103 and into pixel array 121. In some examples, the recessed regions extend into transparent shield 103 $3/4^{th}$ of the way through transparent shield 103.

FIG. 1G illustrates a top down view of still another example of image sensor package 101. Image sensor package 101 depicted in FIG. 1G also shares many similarities with the previously described examples, in accordance with the teachings of the present invention. It should be noted that FIG. 1G is not a true top down view as a second transparent shield 103B has been omitted to avoid obscuring the underlying structure (see FIG. 1H). In the illustrated example, light blocking layer 105 is arranged into two strips which parallel the edges of a transparent shield 103A.

FIG. 1H shows a cross section of image sensor package 101 in FIG. 1G as cut along line A-A'. As depicted, pixel array 121 is disposed in semiconductor material 131 and first transparent shield 103A is adhered to semiconductor material 131. Pixel array 121 is disposed between semiconductor material 131 and first transparent shield 103A. First transparent shield 103A is disposed between pixel array 121 and second transparent shield 103B. Light blocking layer 105 is disposed between first transparent shield 103A and second transparent shield 103B. As in the previous examples, light blocking layer 105 is disposed to prevent light from reflecting off edges of first transparent shield 103A (and/or second transparent shield 103B) into the pixel array 121.

As shown, the lateral bounds of first transparent shield 103A and second transparent shield 103B extend beyond the lateral bounds of pixel array 121. Light blocking layer 105 is disposed between portions of first transparent shield 103A and second transparent shield 103B that extend beyond the lateral bounds of pixel array 121. In other words, light blocking layer 105 is disposed out of the way of image light directed at pixel array 121.

In the depicted example high refractive index material 141 is disposed between first transparent shield 103A and second transparent shield 103B. High refractive index material 141 is also laterally disposed between two portions of the light blocking layer 105. In one example, high refractive index material 141 may be a glass, other oxide, or polymer.

FIG. 1I illustrates a top down view of image sensor package 101. It should be noted that FIG. 1I is not a true top down view as second transparent shield 103B has been omitted to avoid obscuring the underlying structure (see FIG. 1J). In the depicted example, light blocking layer 105 is arranged into two strips which run horizontally along the edges of first transparent shield 103A.

FIG. 1J shows a cross section of image sensor package 101 in FIG. 1I as cut along line A-A'. Image sensor package 101 in FIG. 1J is similar to image sensor package 101 in FIGS. 1G & 1H in that light blocking layer 105 is disposed between first transparent shield 103A and second transparent shield 103B over portions of first transparent shield 103A that extend beyond the lateral bounds of pixel array 121. However, light blocking layer 105 in FIG. 1J is disposed in recessed regions in second transparent shield 103B, and the recessed regions are disposed on a side of second transparent shield 103B opposite an illuminated side. Further, the width of the recessed regions is greater than the depth of the recessed regions into second transparent shield 103B.

In one or more examples, first transparent shield 103A and second transparent shield 103B include glass, and light blocking layer 105 includes a polymer or other organic material. The organic material may be optically or thermally crosslinkable and may include small molecule dyes that absorb large portions of the visible, and even invisible, electromagnetic spectrum.

FIG. 1K illustrates a top down view of image sensor package 101. In the depicted example, light blocking layer 105 is arranged into two strips which run horizontally along the edges of transparent shield 103.

FIG. 1L illustrates a cross section of image sensor package 101 in FIG. 1K as cut along line A-A'. As shown, transparent shield 103 includes recessed regions which are disposed on opposite lateral edges of transparent shield 103. Unlike other examples, the cross section of the recessed regions is triangular. In the depicted example, the recessed regions are entirely filled with light blocking layer 105 such that the surface of light blocking layer 105 is flush with that of transparent shield 103.

FIG. 1M illustrates a top down view of image sensor package 101 similar to image sensor package 101 of FIGS. 1K & 1L. In the depicted example, light blocking layer 105 is arranged into two strips which run horizontally along the edges of transparent shield 103.

FIG. 1N illustrates a cross section of image sensor package 101 in FIG. 1M as cut along line A-A'. As shown, transparent shield 103 includes recessed regions which are disposed on opposite lateral edges of the transparent shield 103. Like FIG. 1L, the cross section of the recessed regions is triangular. However, in the depicted example only a portion of the recessed region includes light blocking layer 105, and light blocking layer 105 is not flush with the top surface of transparent shield 103.

Figure 2A:
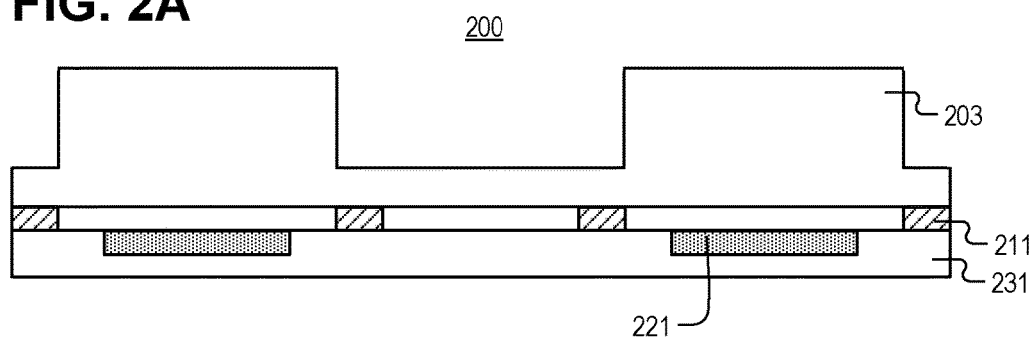
FIGS. 2A-2C illustrate a method of image sensor package fabrication, in accordance with the teachings of the present invention.
Figure 2B:
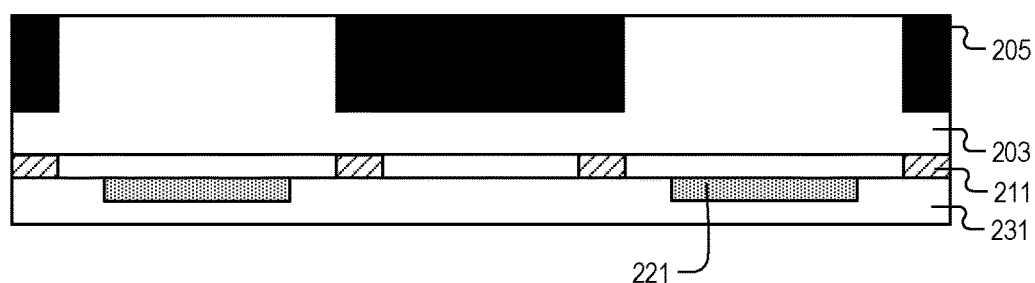
Figure 2C:
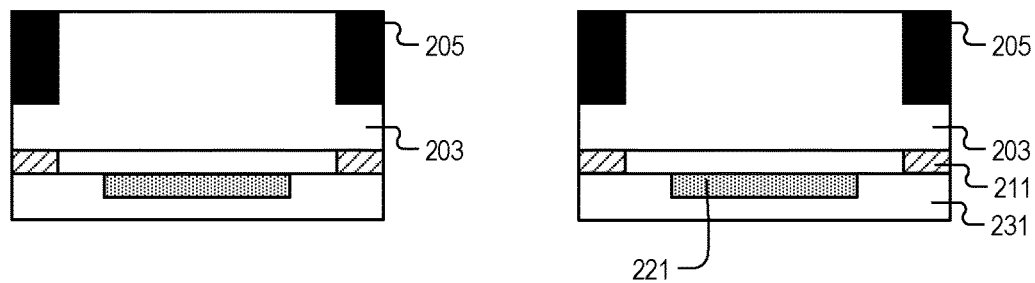

FIGS. 2A-2C illustrate a method 200 of image sensor package fabrication. The order in which some or all steps appear in method 200 should not be deemed limiting. Rather, one of ordinary skill in the art having the benefit of the present disclosure will understand that some of method 200 may be executed in a variety of orders not illustrated, or even in parallel. Furthermore, method 200 may omit certain steps in order to avoid obscuring certain aspects. Alternatively, method 200 may include additional steps that may not be necessary in some embodiments/examples of the disclosure.

FIG. 2A illustrates providing an image sensor, including a pixel array 221 disposed in semiconductor material 231, and a transparent shield 203 adhered to the semiconductor material 231. Pixel array 221 is disposed between semiconductor material 231 and transparent shield 203. Also depicted in FIG. 2A is removing portions of transparent shield 203 to form recessed regions in transparent shield 203. Lateral bounds of transparent shield 203 extend beyond lateral bounds of pixel array 221, and recessed regions are disposed in portions of transparent shield 203 that extend beyond the lateral bounds of pixel array 221.

As shown, the image sensor is one of a plurality of image sensors, and the recessed regions are disposed between individual image sensors in the plurality of image sensors. In the depicted example, portions of transparent shield 203 are removed by laser grooving, and the recessed regions are substantially rectangular. However, depending on laser intensity, the recessed regions may be hemispherical, or rectangular with rounded edges.

FIG. 2B illustrates filling the recessed regions with light blocking layer 205. One of ordinary skill in the art will appreciate that many different techniques may be used to deposit light blocking layer 205 into groves in transparent shield 203. For example, light blocking layer 205 may be deposited via a dispensing method where light blocking layer 205 is directly injected into the recessed regions. Conversely, light blocking layer 205 may be deposited by fabricating a stencil on transparent shield 203 (which aligns with the recessed regions), and printing the light blocking layer 205 into gaps in the stencil/recessed regions. The stencil may subsequently be removed from the surface of transparent shield 203.

Depositing light blocking layer 205 into recessed regions and then removing residual light blocking layer form the surface of transparent shield 203 is advantageous to maintain the integrity of light blocking layer 205 in subsequent device fabrication steps. Furthermore, if light blocking layer 205 was deposited on the surface of transparent shield 203 (not in recessed regions) and then etched to produce optical apertures, light blocking layer 205 may be undercut by etchant resulting in a damaged device architecture. Accordingly, the instant fabrication procedure confers many advantages over alternative options.

Figure 3A:
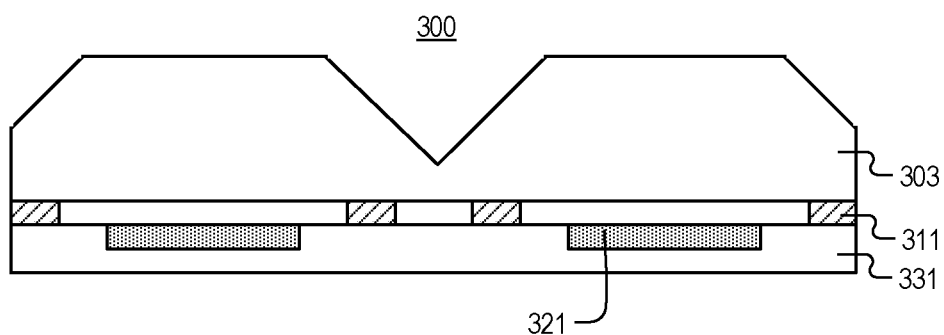
FIGS. 3A-3C illustrate a method of image sensor package fabrication, in accordance with the teachings of the present invention.
Figure 3B:
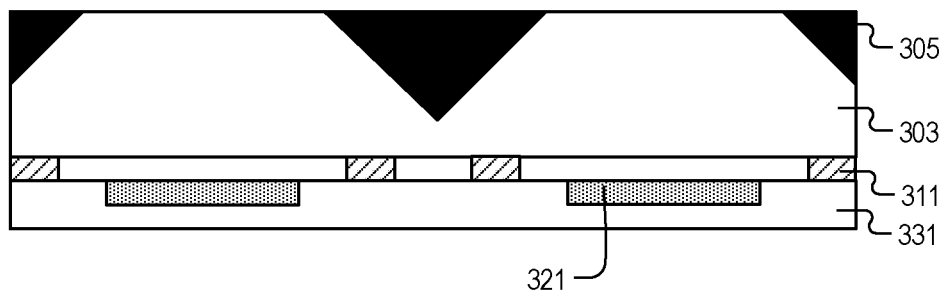
Figure 3C:
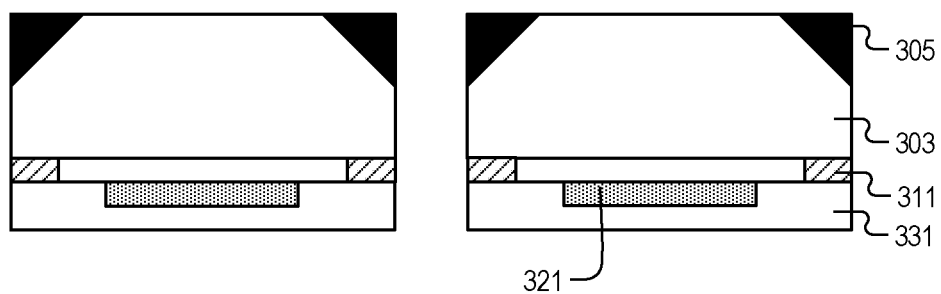

FIG. 2C depicts cutting transparent shield 203 in the recessed regions. The cut extends through light blocking layer 205, transparent shield 203, and semiconductor material 231. As shown, by cutting through all the layers of image sensor package architecture, two separately packaged image sensors are formed with light blocking layer 205 disposed in recessed regions on the edges of transparent shield 203. This technique provides a simply way to fabricate image sensor packaging with a robust anti edge-reflection architecture FIGS. 3A-3C illustrate a method 300 of image sensor package fabrication. The order in which some or all steps appear in method 300 should not be deemed limiting. Rather, one of ordinary skill in the art having the benefit of the present disclosure will understand that some of method 300 may be executed in a variety of orders not illustrated, or even in parallel. Furthermore, method 300 may omit certain steps in order to avoid obscuring certain aspects. Alternatively, method 300 may include additional steps that may not be necessary in some embodiments/examples of the disclosure.

Like FIG. 2A, FIG. 3A depicts providing an image sensor, including a pixel array 321 disposed in semiconductor material 311, and a transparent shield 303 adhered to the semiconductor material 331. Portions of transparent shield 303 have been removed to form recessed regions in transparent shield 303. In the depicted example, recessed regions of transparent shield 303 were removed by a mechanical saw. Accordingly, the recessed regions are substantially triangular. However, the geometry of recessed regions may be circular, square or the like depending on the angle/geometry of the saw blade.

FIG. 3B depicts filling the recessed regions with light blocking layer 305. In the depicted example, the recessed regions are completely filled with light blocking layer 305 such that the light blocking layer 305 is flush with the surface of transparent shield 303. However, in other examples not depicted, light blocking layer 305 is not flush with the surface of transparent shield 303. Light blocking layer 305 may be uniform thickness and disposed on the walls of the recessed regions (see FIG. 1N).

FIG. 3C depicts cutting transparent shield 303 in the recessed regions. The cut extends through light blocking layer 305, transparent shield 303, and semiconductor material 331. As shown, by cutting through all the layers of image sensor package architecture, two separately packaged image sensors are formed with light blocking layer 305 disposed in recessed regions on the edges of transparent shield 303.

Figure 4A:
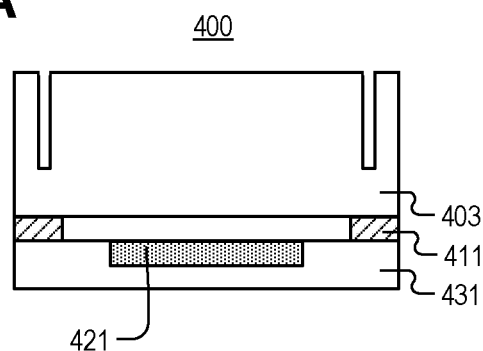
FIGS. 4A-4B illustrate a method of image sensor package fabrication, in accordance with the teachings of the present invention.
Figure 4B:
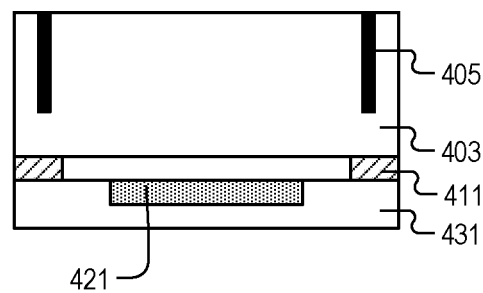

FIGS. 4A-4B illustrate a method 400 of image sensor package fabrication. The order in which some or all steps appear in method 400 should not be deemed limiting. Rather, one of ordinary skill in the art having the benefit of the present disclosure will understand that some of method 400 may be executed in a variety of orders not illustrated, or even in parallel. Furthermore, method 400 may omit certain steps in order to avoid obscuring certain aspects. Alternatively, method 400 may include additional steps that may not be necessary in some embodiments/examples of the disclosure.

In FIG. 4A, transparent shield 403, pixel array 421, semiconductor material 431, and dams 411 have been provided and assembled to form a partially complete image sensor package. Also, portions of transparent shield 403 have been removed via an etching process to form recessed regions. In one example, the surface of transparent shield 403 was patterned with a photoresist and then recessed regions were etched into transparent shield 403 via a wet or dry etch. In one example, the recessed regions are etched into an offset staggered pattern on opposite lateral sides of transparent shield 403 (see e.g., FIG. 1E).

FIG. 4B depicts backfilling the etched recessed regions with light blocking layer 405. This may be accomplished by coating light blocking layer 405 onto the surface of the transparent shield 403, and then removing excess light blocking layer 405 from the surface. In one example, light blocking layer 405 includes an organic material that absorbs a majority of wavelengths in the visible spectrum.

Figure 5A:
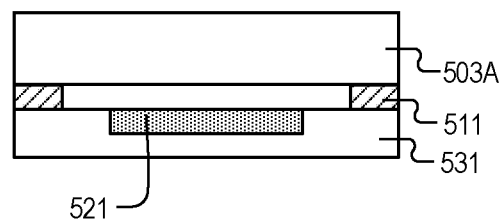
FIGS. 5A-5C illustrate a method of image sensor package fabrication, in accordance with the teachings of the present invention.
Figure 5B:
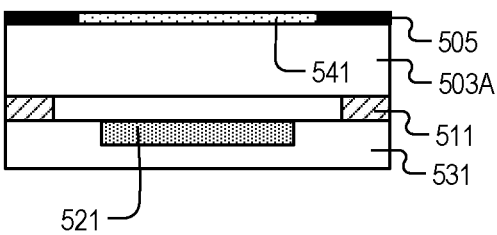

FIGS. 5A-5B illustrate a method 500 of image sensor package fabrication. The order in which some or all steps appear in method 500 should not be deemed limiting. Rather, one of ordinary skill in the art having the benefit of the present disclosure will understand that some of method 500 may be executed in a variety of orders not illustrated, or even in parallel. Furthermore, method 500 may omit certain steps in order to avoid obscuring certain aspects. Alternatively, method 500 may include additional steps that may not be necessary in some embodiments/examples of the disclosure.

In FIG. 5A, first transparent shield 503A, pixel array 521, semiconductor material 531, and dams 511 have been provided and assembled to form a partially complete image sensor package. Pixel array 521 is disposed in semiconductor material 531, and first transparent shield 503A is adhered to the semiconductor material 531.

FIG. 5B illustrates depositing light blocking layer 505 disposed between the lateral edges of pixel array 521 and the lateral edges of first transparent shield 503A. Additionally, high index of refraction material 541 is optically aligned with the pixel array 521 and disposed on first transparent shield 503A. In one example, depositing the high index of refraction 541 material includes depositing glass.

Figure 5C:
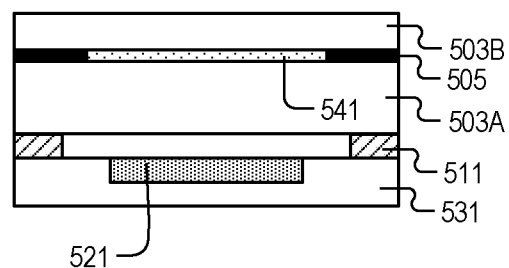

FIG. 5C depicts placing second transparent shield 503B on the image sensor package, such that light blocking layer 505 is disposed between first transparent shield 503A and second transparent shield 503B.

In one example not depicted, second transparent shield 503B has recessed regions disposed on lateral edges of second transparent shield 503B, and the light blocking layer 505 is deposited in the recessed regions. Additionally, high index of refraction material 541 may be disposed between light blocking layer 505 and first transparent shield 503A.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of image sensor package fabrication, comprising:
    providing an image sensor, including a pixel array disposed in a semiconductor material, and a first transparent shield adhered to the semiconductor material, wherein the pixel array is disposed between the semiconductor material and the first transparent shield;
    depositing a light blocking layer disposed between lateral edges of the pixel array and lateral edges of the first transparent shield; and
    placing a second transparent shield on the image sensor package, wherein the light blocking layer is disposed between the first transparent shield and the second transparent shield.

2. The method of claim 1, further comprising depositing a high index of refraction material optically aligned with the pixel array and disposed between the first transparent shield and the second transparent shield.

3. The method of claim 2, wherein depositing the high index of refraction material includes depositing glass.

4. The method of claim 1, wherein the second transparent shield has recessed regions disposed on lateral edges of the second transparent shield, and wherein the light blocking layer is deposited in the recessed regions.

5. The method of claim 4, further comprising depositing a high index of refraction material disposed between the light blocking layer and the first transparent shield.

* * * * *